(12) United States Patent
Quaedackers et al.

(10) Patent No.: US 7,307,687 B2
(45) Date of Patent: Dec. 11, 2007

(54) LITHOGRAPHIC APPARATUS, DEVICE MANUFACTURING METHOD AND SUBSTRATE

(75) Inventors: Johannes Anna Quaedackers, Veldhoven (NL); Koen Van Ingen Schenau, Veldhoven (NL); Patrick Wong, Deurne (BE); Michel Franciscus Johannes Van Rooy, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 100 days.

(21) Appl. No.: 11/378,634

(22) Filed: Mar. 20, 2006

(65) Prior Publication Data

US 2007/0216883 A1 Sep. 20, 2007

(51) Int. Cl.
*G03B 27/52* (2006.01)
*G03B 27/54* (2006.01)

(52) U.S. Cl. .................. 355/30; 355/53; 355/67; 355/71; 378/34; 430/270.1; 430/298

(58) Field of Classification Search .......... 355/30, 355/53, 67
See application file for complete search history.

(56) References Cited

U.S. PATENT DOCUMENTS 4,509,852 A 4/1985 Tabarelli et al.
6,952,253 B2 10/2005 Lof et al.
2002/0163629 A1 11/2002 Switkes et al.
2006/0194142 A1* 8/2006 Lin .................. 430/270.1

FOREIGN PATENT DOCUMENTS

WO 99/49504 9/1999

OTHER PUBLICATIONS

Masaya Ichimura et al., "Structural and optical characterization of CdS films grown by photochemical deposition", Journal of Applied Physics, vol. 85, No. 10, pp. 7411-7417 (1999).

* cited by examiner

*Primary Examiner*—D. Rutledge
(74) *Attorney, Agent, or Firm*—Pillsbury Winthrop Shaw Pittman LLP

(57) ABSTRACT

An immersion lithographic apparatus provides an immersion liquid including photosensitive material(s) configured to form a patterned film on the surface of a substrate on exposure to a radiation beam. Irradiation through the immersion liquid onto a substrate leads to deposition of a film on the substrate. Film formation occurs only in the photoirradiated region, so that the film formed has a pattern corresponding to the pattern of the radiation.

14 Claims, 3 Drawing Sheets

LITHOGRAPHIC APPARATUS, DEVICE MANUFACTURING METHOD AND SUBSTRATE

BACKGROUND OF THE INVENTION

1. Field of the Invention

The present invention relates to a lithographic apparatus, a method for manufacturing a device and a silicon substrate having a patterned film thereon.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet IN onto the substrate, preferably along the direction of movement of the substrate relative to the final element of the projection system, and is removed by at least one outlet OUT after having passed under the projection system PL. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible. One example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system PL in the XY plane though there may be some relative movement in the Z direction (in the direction of the optical axis). A seal is formed between the seal member and the surface of the substrate. Preferably the seal is a contactless seal such as a gas seal. Such as system with a gas seal is disclosed in U.S. Pat. No. 6,952,253 and illustrated in FIG. 5.

In U.S. Pat. No. 6,952,253, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

Current lithographic processes require a complex series of processes to be completed in order to produce the patterned substrate. In particular, numerous prime, coat and bake processes are needed to prepare the substrate with the necessary resist and topcoat layers prior to exposure. After exposure, further baking, removal of topcoat and development processes are required. This essential track processing adds to the complexity of the device manufacturing process. These processes can also cause the critical dimension uniformity (CDU) to be adversely affected.

It is an ongoing aim in the field of lithographic processing to provide ever decreasing line widths. Current processing methods however have inherent limitations in the minimum line widths that can be achieved.

SUMMARY OF THE INVENTION

It is desirable to provide an apparatus and process which enable track processing to be simplified. It is also desirable to provide an improvement in the CDU as well as to enable yet shorter line widths to be accessed.

According to an embodiment of the invention, there is provided a lithographic apparatus including a liquid supply system configured to supply an immersion liquid to a space between a final element of a projection system and a substrate, wherein the immersion liquid includes a photosensitive material configured to form a film on a substrate on exposure to a radiation beam.

According to an aspect of the invention, there is provided a device manufacturing method including projecting a patterned beam of radiation through an immersion liquid onto a substrate, wherein the immersion liquid includes a photosensitive material, and wherein the photosensitive material and/or the photochemical product thereof are deposited onto the substrate in an area exposed to the patterned beam of radiation, providing a patterned film of the photosensitive material and/or the photochemical product thereof on the substrate.

According to an aspect of the invention, there is provided a silicon substrate having a patterned film deposited thereon, the substrate being manufactured in accordance with the method of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
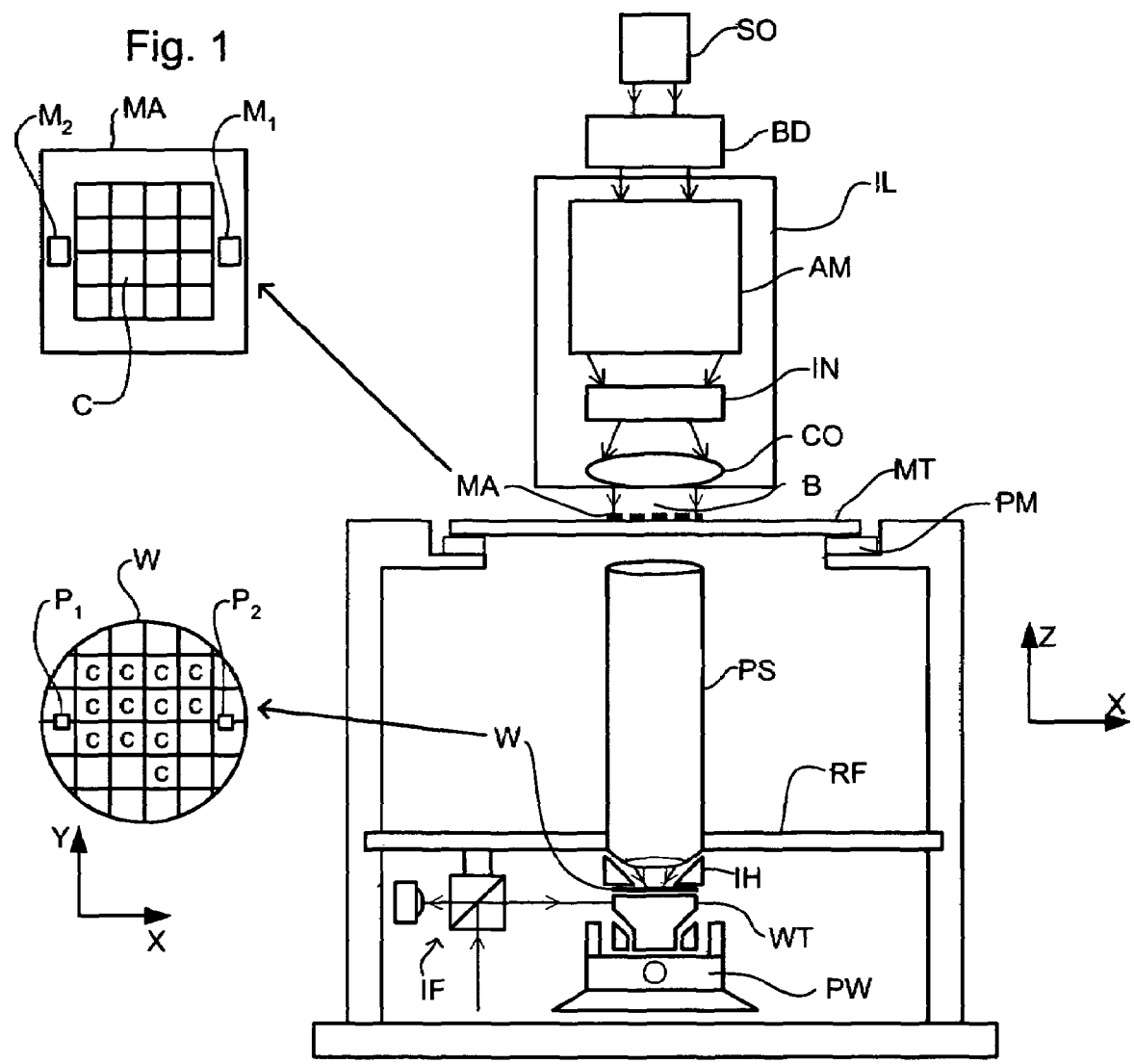
FIG. 1 depicts a lithographic apparatus according to an embodiment of the invention.
Figure 2:
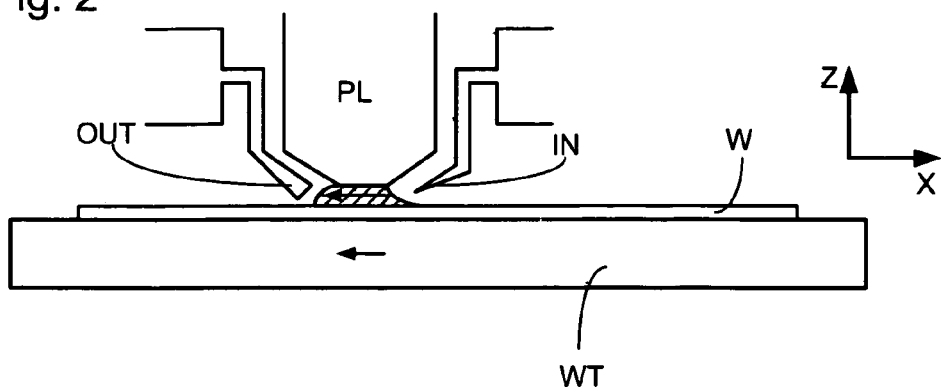
FIGS. 2 and 3 depict a liquid supply system used in a prior art lithographic projection apparatus.
Figure 3:
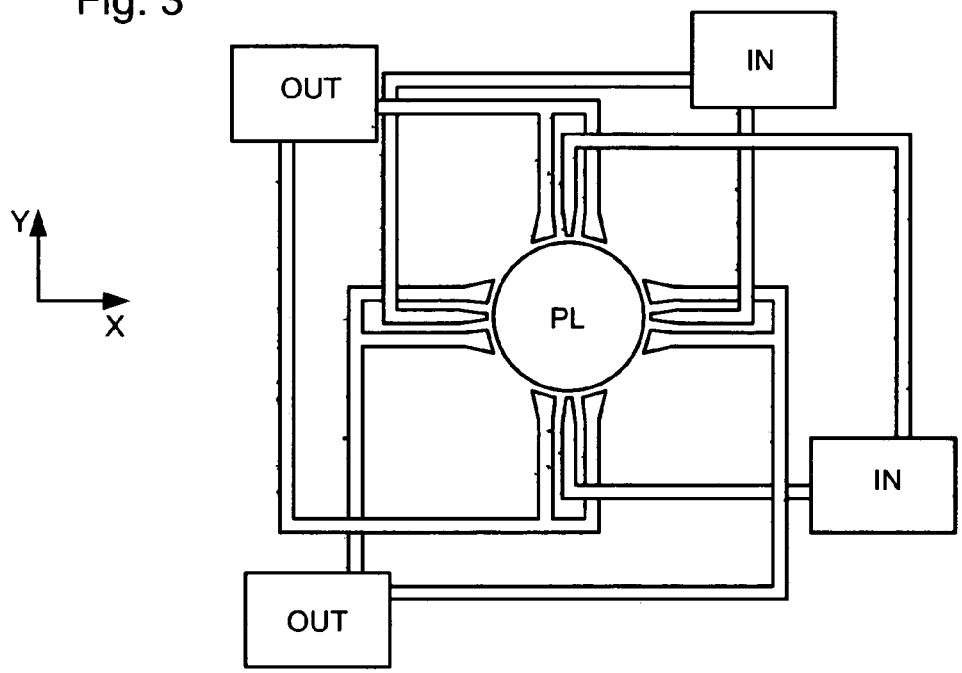
Figure 4:
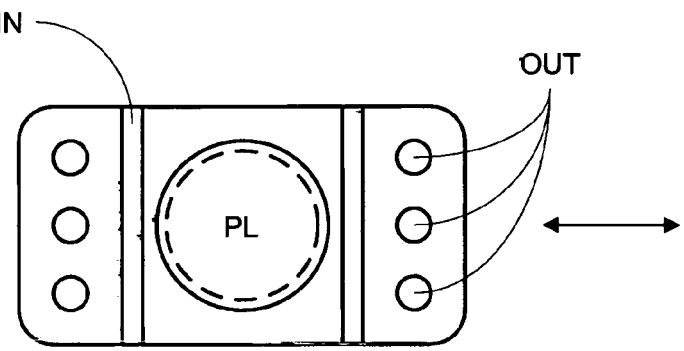
FIG. 4 depicts a liquid supply system according to another prior art lithographic projection apparatus.
Figure 4:
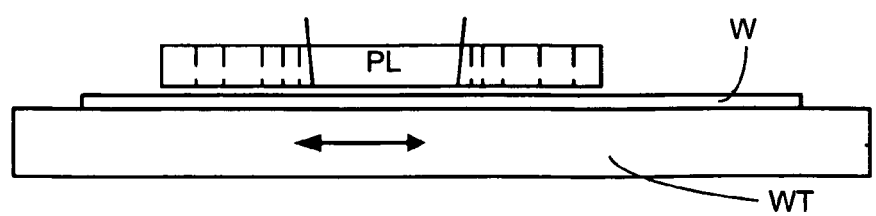
Figure 5:
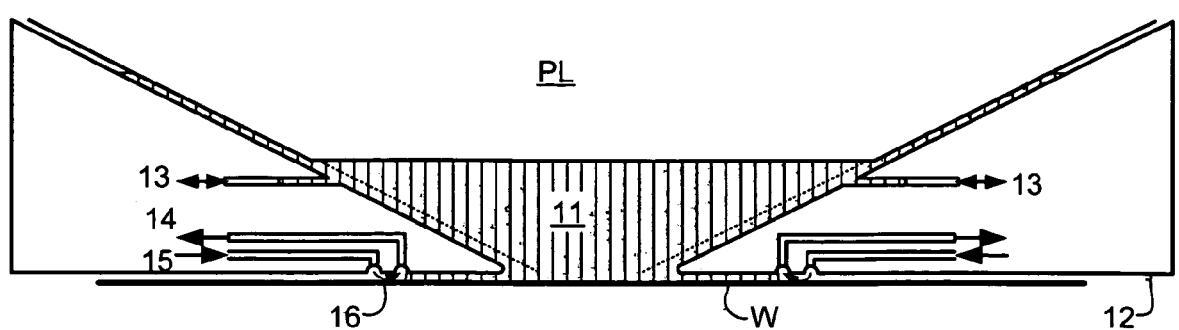
FIG. 5 depicts a localized area liquid supply system.

FIG. 1 schematically depicts a lithographic apparatus according to an embodiment of the invention. The apparatus includes an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The present invention relates to an immersion lithographic apparatus such as those depicted in FIGS. 2 to 5 and described above, each of which are appropriate for use with this invention. The features of FIG. 5 will be referred to hereinafter, although it should be understood that alternative apparatus may be employed.

The apparatus includes a liquid supply system which supplies an immersion liquid to the reservoir 11 separating projection system PL from substrate W. The liquid supply system includes a source of the immersion liquid such as a container (not depicted) connected via any required conduits and/or valves to inlet(s) 13. The reservoir is sealed with a gas seal 16 using gas inlet 15 and a gas outlet 14. The apparatus typically includes the immersion liquid, the immersion liquid being present in the liquid supply system and/or in the reservoir 11.

Figure 6:
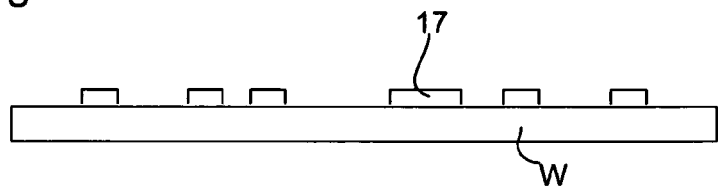
FIG. 6 depicts a patterned film on a substrate.

The immersion liquid used in the present invention includes one or more photosensitive materials. The photosensitive material(s) is capable of film formation on the substrate on exposure to the radiation beam. In other words, on photochemical activation of these materials by the radiation beam, a film is deposited onto the surface of the substrate. The film may be formed of the photosensitive material(s) themselves, or it may include a photochemical product of the photosensitive material(s). Deposition of the film occurs only on activation of the photosensitive materials, and only in photoirradiated regions. Therefore, irradiation by the patterned radiation beam causes a correspondingly patterned film to build up on the surface of the substrate. A thus produced patterned film 17 on a substrate W is depicted in FIG. 6.

In this manner, the present invention enables a patterned film to be directly formed on the substrate in the lithographic apparatus. The invention therefore eliminates the need for a photoresist to be applied to the substrate prior to exposure and thus significantly reduces the track processing required. Further, since patterning occurs in situ, post exposure processing is also simplified. The present invention therefore requires significantly fewer track processes than are currently used in the art and may even permit the complete elimination of in line track processing. In situ formation of the patterned film on the substrate also provides improvement in CDU.

It should be appreciated that a photosensitive material capable of film formation on a substrate on exposure to a radiation beam may be determined by various processes or methods. For example, the material in question can be dissolved in an immersion liquid and the immersion liquid contacted with a substrate such as a silicon substrate. Exposure of the substrate to radiation in the UV or EUV region can then be carried out. Inspection of the material post exposure, e.g. visually or by use of appropriate magnification, will indicate whether film formation has occurred.

The process of the present invention may be employed using typical UV or EUV wavelengths as the radiation beam. 248 nm, 193 nm and 126 nm are examples of wavelengths which may be adopted. Irradiation may be carried out at room temperature.

The photosensitive material(s) may dissolved in the immersion liquid. Where water is used as the immersion liquid, the photosensitive materials should therefore be water soluble. Non-water soluble photosensitive materials, however, may also be used where the immersion liquid is other than water.

In one embodiment, the photosensitive materials are organic molecules such as the organic polymers currently used as the photoresist. These materials should be capable of film formation (either with or without associated photochemical reaction) on the substrate on activation by the radiation beam.

In an alternative embodiment, the photosensitive material(s) are low molecular weight compounds such as small organic molecules or inorganic molecules. The photosensitive materials, for example, have a molecular weight of less than 1000, preferably less than 500 or less than 300. It is further preferred that the film formed on activation of the photosensitive materials consists essentially of compounds of molecular weight of less than 1000, preferably less than 500 or less than 300. This embodiment has the advantage that the pattern on the substrate is formed by smaller molecules, consequently reducing line width roughness. Such reduction in line width roughness will enable even smaller line widths to be accessed than is currently achievable using conventional resist technology.

Inorganic photosensitive materials soluble in water are desirable in the context of the invention. Examples of inorganic films which can be photochemically deposited onto the substrate include Cd and Zn chalcogenides, in particular the Cd chalcogenides. CdS and CdTe, in particular CdS, are desirable. Mixtures of these materials, including mixed Zn/Cd compounds can also be used.

In order to generate such inorganic films on the substrate, photosensitive materials are used which include the necessary ions and/or which photochemically react on exposure to the radiation beam to provide such ions. For example, in the case of CdS, a water soluble $Cd^{2+}$ salt such as $CdSO_4$, as well as a source of sulfide such as $S_2O_3^{2-}$ (e.g. $Na_2S_2O_3$), are used as the photosensitive materials. Exposure of an immersion liquid including such photosensitive materials leads to generation of a CdS film on the substrate in the exposed areas (Journal of Applied Physics, Vol. 85, Issue 10 pp 7411-7417). Similarly, $ZnSO_4$ can be used as the photosensitive material where a Zn chalcogenide film is required and appropriate water soluble salts may be used to generate the required chalcogenide.

Further details of the process are given hereafter for the specific example of CdS film formation, however it should be appreciated that it is possible to adapt this process as necessary to produce alternative films. The immersion liquid may be pure water having dissolved therein $2.0 \times 10^{-3}$ M $CdSO_4$ and $1.0 \times 10^{-3}$ M $Na_2S_2O_3$. The pH of the immersion liquid may be about neutral (pH 7). Acidic immersion liquids may also be used by addition of an appropriate acid, e.g. $H_2SO_4$. The immersion liquid thus prepared is supplied to the reservoir 11 and exposure of a substrate is carried out through the immersion liquid. A film of CdS is built up on the surface of the substrate in a pattern corresponding to the patterned beam of radiation. The film may have a thickness of approximately 1 μm.

Prior to exposure of the substrate, it is not necessary to provide a coating of photoresist. However, appropriate pre-exposure coatings may be applied as desired. Following exposure, the substrate having a patterned film deposited thereon may be directly etched and the patterned film then removed. Any desired baking processes may also be included, for example prior to etching.

Further details regarding the conditions under which CdS films can be formed are found in the Journal of Applied Physics, Vol. 85, Issue 10 pp. 7411-7417. These conditions may be adapted as required for use in a photolithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   a liquid supply system configured to supply an immersion liquid to a space between an element of a projection system and a substrate, wherein the immersion liquid comprises a photosensitive material configured to form a film on a substrate on exposure to a radiation beam.

2. A lithographic apparatus according to claim 1, wherein the liquid supply system and/or the space between the element of the projection system and the substrate contains the immersion liquid.

3. A lithographic apparatus according to claim 1, wherein the photosensitive material is configured to form the film consisting essentially of compounds having a molecular weight of less than 1000.

4. A lithographic apparatus according to claim 1, wherein the photosensitive material is configured to form the film of an inorganic compound.

5. A lithographic apparatus according to claim 1, wherein the photosensitive material is configured to form the film of CdS.

6. A lithographic apparatus according to claim 5, wherein the photosensitive material is $Cd^{2+}$ salt and an $S_2O_3^{2-}$ salt.

7. A device manufacturing method, comprising:
   projecting a patterned beam of radiation through an immersion liquid onto a substrate, wherein the immersion liquid comprises a photosensitive material, and the photosensitive material and/or a photochemical product thereof are deposited onto the substrate in an area exposed to the patterned beam of radiation, providing a patterned film of the photosensitive material and/or the photochemical product thereof on the substrate.

8. A method according to claim 7, wherein the substrate does not comprise a photoresist coating.

9. A method according to claim 7, wherein the patterned film consists essentially of compounds having a molecular weight of less than 1000.

10. A method according to claim 7, wherein the patterned film comprises an inorganic compound.

11. A method according to claim 7, wherein the patterned film comprises CdS.

12. A silicon substrate having a patterned film deposited thereon, the patterned film formed by a method including projecting a patterned beam of radiation through an immersion liquid onto a substrate, wherein the immersion liquid comprises a photosensitive material, and the photosensitive material and/or a photochemical product thereof are deposited onto the substrate in an area exposed to the patterned beam of radiation, providing a patterned film of the photosensitive material and/or the photochemical product thereof on the substrate.

13. A silicon substrate according to claim 12, wherein the patterned film consists essentially of compounds having a molecular weight of less than 1000.

14. A silicon substrate according to claim 12, wherein the patterned film comprises CdS.

* * * * *